(12) United States Patent
Chen et al.

(10) Patent No.: US 6,870,457 B2
(45) Date of Patent: Mar. 22, 2005

(54) SYMMETRICAL STACKED INDUCTOR

(75) Inventors: Wei-Zen Chen, Jung-Li (TW); Wen-Hui Chen, Jung-Li (TW)

(73) Assignee: National Central University, Taoyuan (TW)

(*) Notice: Subject to any disclaimer, the term of this patent is extended or adjusted under 35 U.S.C. 154(b) by 0 days.

(21) Appl. No.: 10/638,408

(22) Filed: Aug. 12, 2003

(65) Prior Publication Data

US 2004/0108933 A1 Jun. 10, 2004

(30) Foreign Application Priority Data

Dec. 10, 2002 (TW) .................................... 91135635 A

(51) Int. Cl.⁷ ............................................... H01F 5/00
(52) U.S. Cl. ...................... 336/200; 336/83; 336/192; 336/65
(58) Field of Search ............................ 336/65, 83, 183, 336/192, 200, 206, 207, 208, 223, 232; 29/602.1

(56) References Cited

U.S. PATENT DOCUMENTS 5,610,433 A * 3/1997 Merrill et al. ............... 257/531
6,611,188 B2 * 8/2003 Yeo et al. .................... 336/192

* cited by examiner

Primary Examiner—Lincoln Donovan
Assistant Examiner—Jennifer A. Poker
(74) Attorney, Agent, or Firm—Rosenberg, Klein & Lee

(57) ABSTRACT

A symmetrical stacked inductor comprising a plurality of conductive layers using at least one conductive line formed out of a symmetrical and geometric conductive layer and having at least one inter-metal dielectric layer for isolating each conductive layer, and wherein the conductive line does not intersect; and a plurality of vias placed between the inter-metal dielectric layers for electrical conduction.

6 Claims, 14 Drawing Sheets

SYMMETRICAL STACKED INDUCTOR

BACKGROUND OF THE INVENTION

1. Field of the Invention

The present invention relates to a stacked inductor, more particularity, to a symmetrical stacked inductor made by a semiconductor process and applied to a radio frequency circuit.

2. Description of the Related Art

The rapid development of communication technology forced the communication market to expand and requires more channels. Presently, portable communication devices have developed into devices with high frequency, light, thin, short, small and multiple functions so that the requirement of high accuracy, exactitude, credibility and modularizing is needed. The effect of high frequency wireless communication focuses on the design of the radio frequency circuit, and the high frequency inductor of the radio frequency circuit requires a high quality factor(Q), high self-resonant frequency, low parasitic capacitance output and high stability, but it is hard to observe all factors during design.

Refer to FIG. 1, the conventional inductor 3, for example: a spiral inductor and a micro 3D inductor applied to a symmetrical circuit such as an LC voltage control oscillator (LC VCO) comprising two conventional inductors 3, two capacitors 5, a cross coupled circuit 7 and a tapped device 9. The design of the LC voltage control oscillator 1 must be symmetrical. If not, two conventional inductors have to be used for maintaining the symmetrical property of the oscillator circuit. The conventional design occupies a large area of the circuit layout, is expensive and is ineffective in decreasing phase noise.

SUMMARY OF THE INVENTION

It is an object of the present invention to provide a symmetrical stacked inductor which discloses a structure made up by symmetrical inductors for decreasing the quantity of inductors in the design of a radio frequency circuit.

It is another object of the present invention to provide a structure made up by symmetrical stacked inductors which increases the quality factor of the inductors.

It is still another object of the present invention to provide a structure made up by symmetrical stacked inductors which decreases the phase noise of the radio frequency circuit.

The present invention comprises a plurality of conductive layers formed of symmetrical and geometric conductive layers, and each conductive layer is placed between respective inter-metal dielectric layers for isolating the conductive layers. Each conductive layer comprises at least one conductive line forming a symmetrically and geometrically shaped, for example: rectangle, circle or other forms, conductive layer. Each inter-metal dielectric layer includes a plurality of via plugs for connecting upper and lower conductive layers.

BRIEF DESCRIPTION OF THE DRAWINGS

The above and further objects, features and advantages of the invention will become clear from the following more detailed description when read with reference to the accompanying drawings in which.

DETAILED DESCRIPTION OF THE PREFERRED EMBODIMENTS

Figure 2:
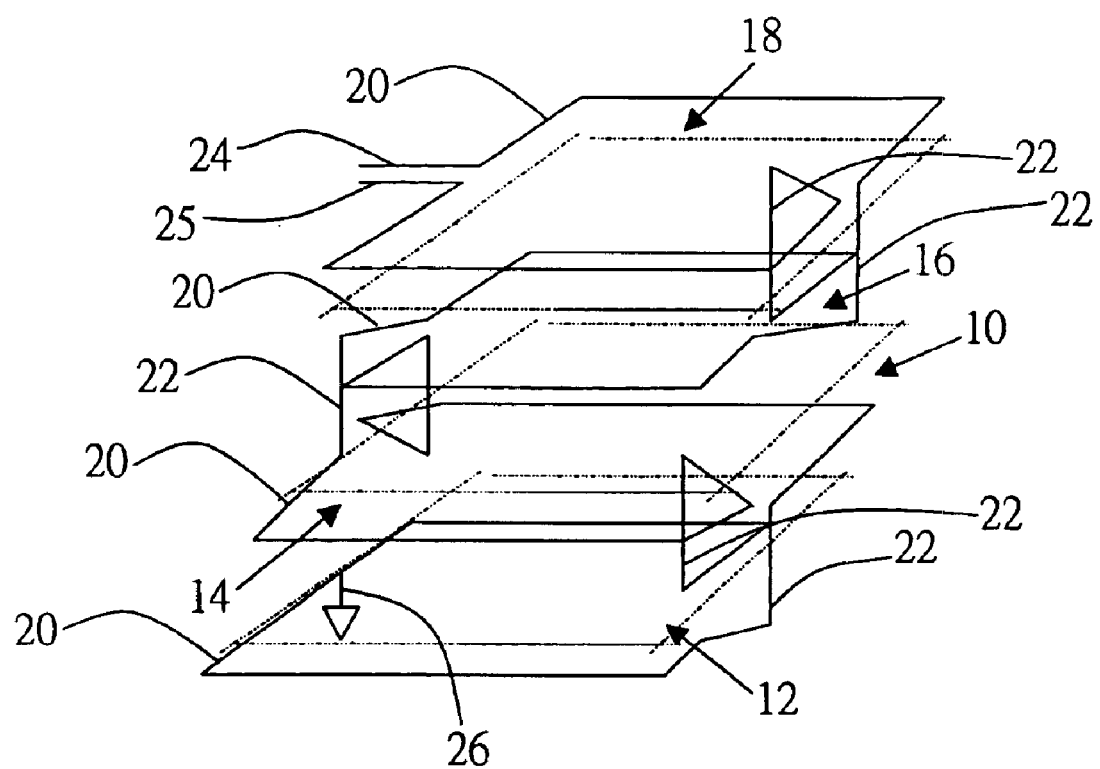
FIG. 2 is a schematic view of a symmetrical stacked inductor according to an embodiment of the present invention.

Refer to FIG. 2, an embodiment of the present invention is directed to a symmetrical inductor 10 formed on the semiconductor and it comprises a first conductive layer 12, a second conductive layer 14, a third conductive layer 16 and a fourth conductive layer 18 wherein each conductive layer 12, 14, 16, 18 is a symmetrically and geometrically shaped conductive layer and on a respective plane of the inter-metal dielectric layer of the semiconductor. The conductive layers 12, 14, 16, 18 are isolated respectively by an inter-metal dielectric layer (depicted by dotted lines), and each of them use at least a conductive line 20 forming a symmetrical and geometric conductive layer. Further, the diameters of the even conductive layers 14, 18 (second and fourth layers) and those for the odd conductive layers 12, 16 (first and third layers) can be different to reduce parasitic capacitance. The form of the conductive layers 12, 14, 16, 18 could be, for example, circular or other forms. A plurality of via plugs 22 are placed in the inter-metal dielectric layer for connecting the upper and lower side of neighboring conductive layers 12, 14, 16, 18 for electrical conduction. The fourth conductive layer 18 comprises a first port 24 and a second port 25, and the inductor 10 is a symmetrical shape whether from the view of the first port 24 or second port 25. Further, the middle of the inductor 10 can be center-tapped to a common mode voltage at 26.

Figure 1:
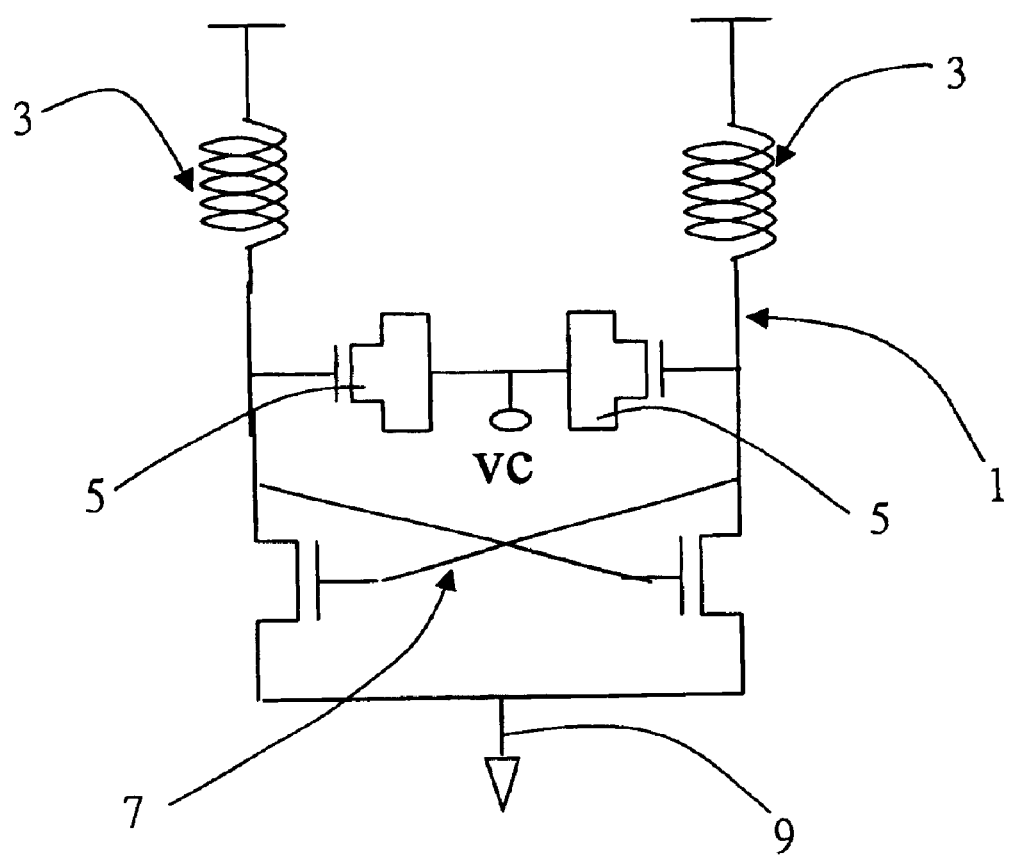
FIG. 1 is a circuit diagram using a conventional inductor in the construction of an LC voltage control oscillator of the prior art.
Figure 3A:
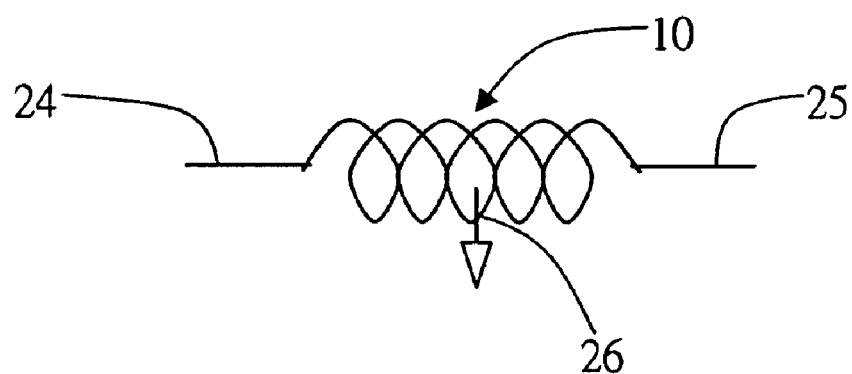
FIG. 3A is a symbol diagram of FIG. 2 according to an embodiment of the present invention.
Figure 3B:
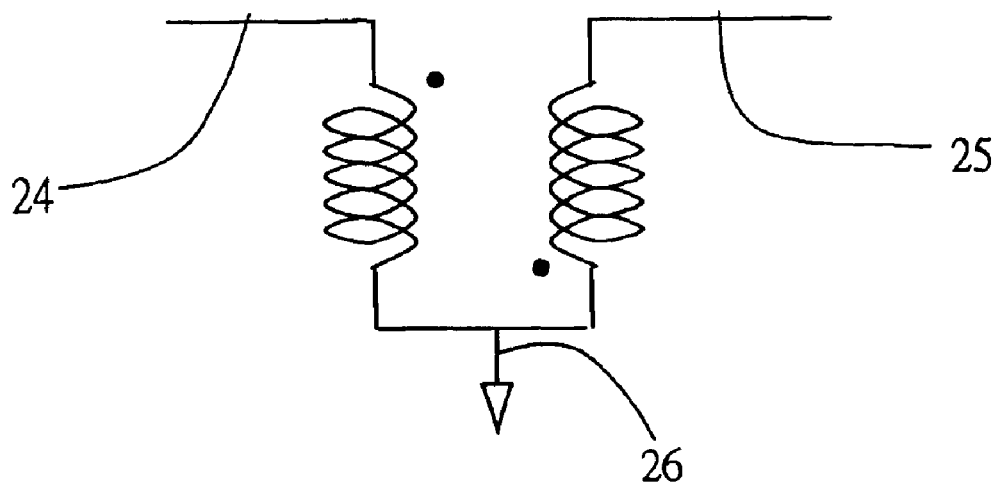
FIG. 3B is a symbol diagram for using two conventional inductors of the prior art.
Figure 3C:
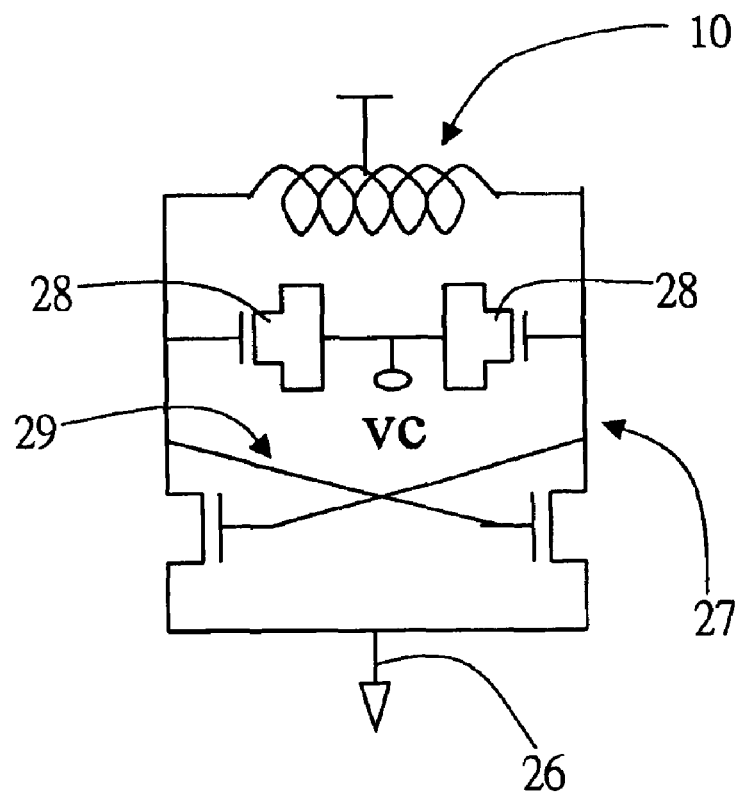
FIG. 3C is a circuit diagram for using the inductor applied to an LC voltage control oscillator according to an embodiment of the present invention.

Refer to FIGS. 3A, 3B and 3C, by center-tapping 26 of the inductor 10 to ground or DC voltage, as shown in FIG. 3A, the construction becomes an inverting-type transformer (refer to FIG. 3B). Referring to FIG. 3C, the inductor 10 applied to an LC voltage controlled oscillator 27 comprising an inductor 10, a set of capacitors 28, a cross-coupled pair 29. When the inductor 10 is used in a symmetrical circuit, the LC voltage controlled oscillator 27 only uses one inductor 10 for replacing two non-symmetrical and independent inductors 3 (FIG. 1) to decrease the design cost and layout circuit area.

Figure 4A:
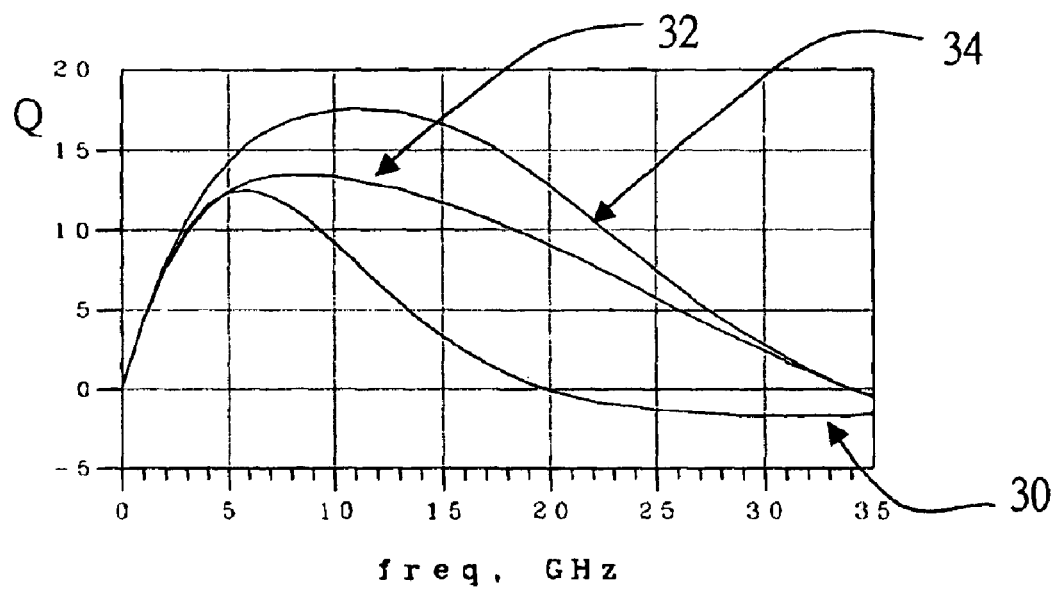
FIG. 4A is a wave diagram of a spiral inductor of the prior art.
Figure 4B:
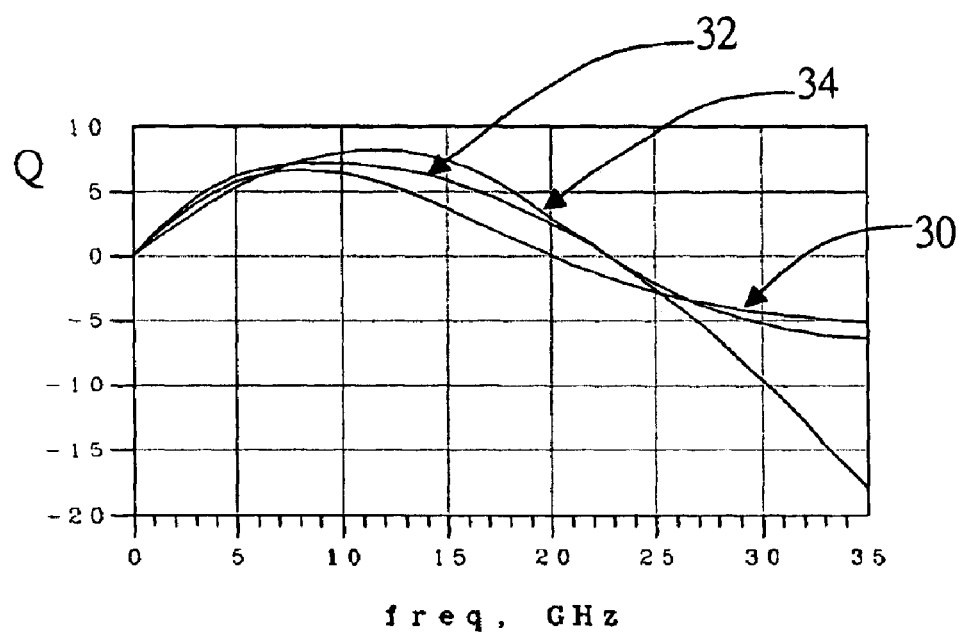
FIG. 4B is a wave diagram of a micro 3D inductor of the prior art.
Figure 4C:
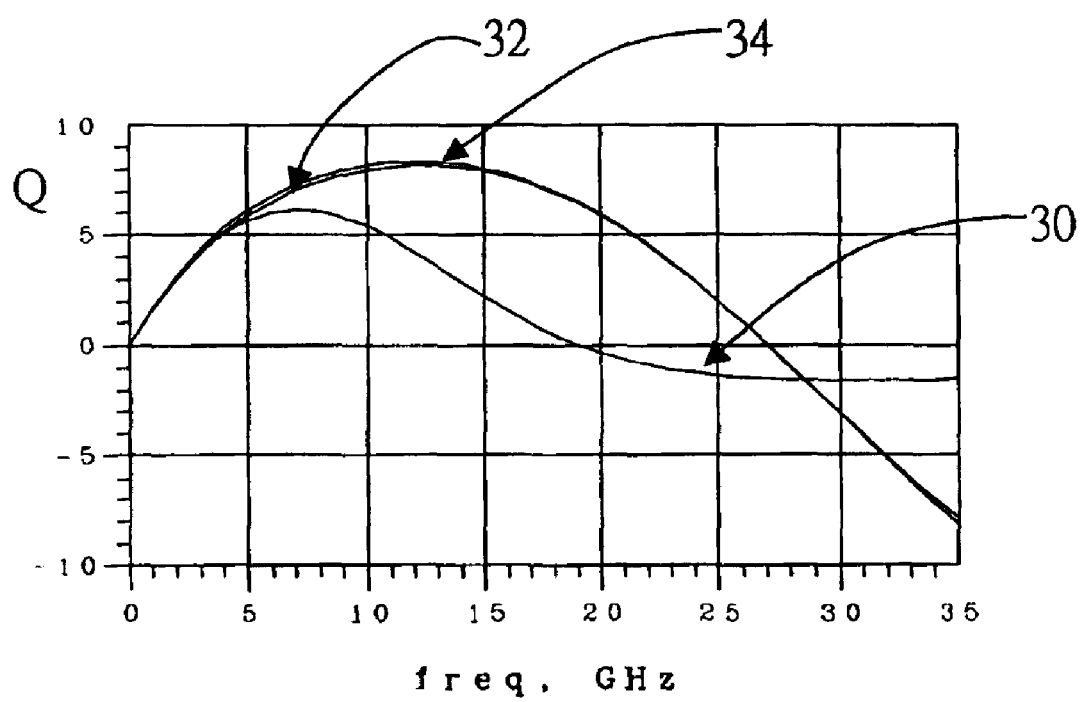
FIG. 4C is a wave diagram of a symmetrical stacked inductor according to an embodiment of the present invention.

FIGS. 4A, 4B and 4C, respectively show the one port and two port measurement results of planar spiral inductor (asymmetric), micro 3D inductor (asymmetric), and the proposed symmetric 3D inductors. The one port measurement is done with the other port being ground. Referring to FIGS. 4A and 4B, the one port measurement results of conventional inductors, such as, a spiral inductor and micro 3D inductor, do not totally overlap, leading to bad symmetry properties, as shown by curves 32 and 34 in FIGS. 4A and 4B. Referring to FIG. 4C, the wave lines 32 and 34 almost overlap which shows that the inductor is a symmetrical inductor which can be applied to a symmetrical circuit. Therefore, the symmetrical inductor 10 can be applied in a symmetrical circuit to replace the conventional two asymmetric inductors and reduce circuit layout area.

Figure 5:
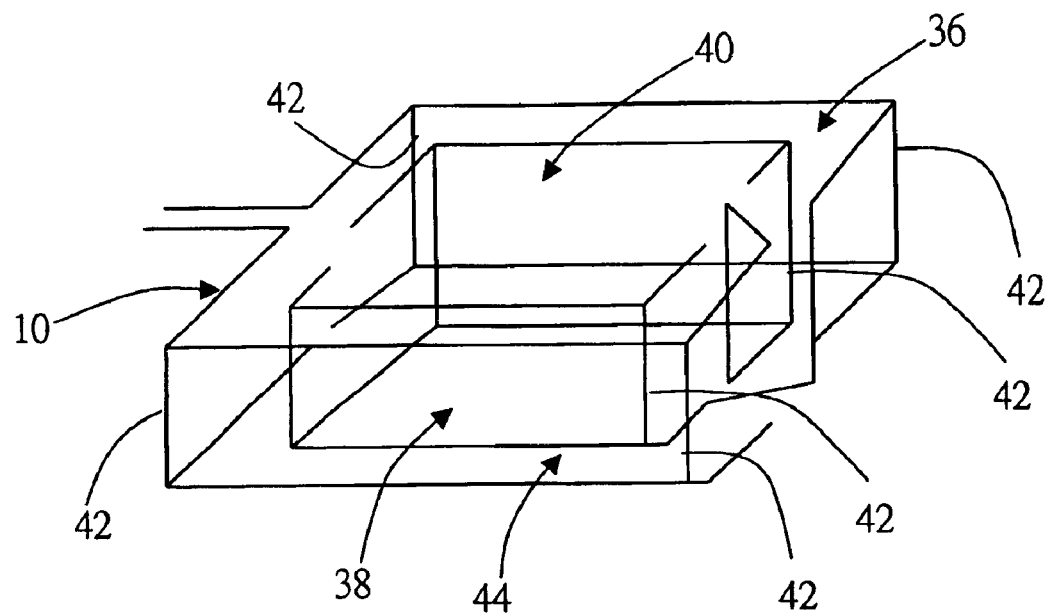
FIG. 5 is a schematic view of a symmetrical stacked inductor according to another embodiment of the present invention.
Figure 6:
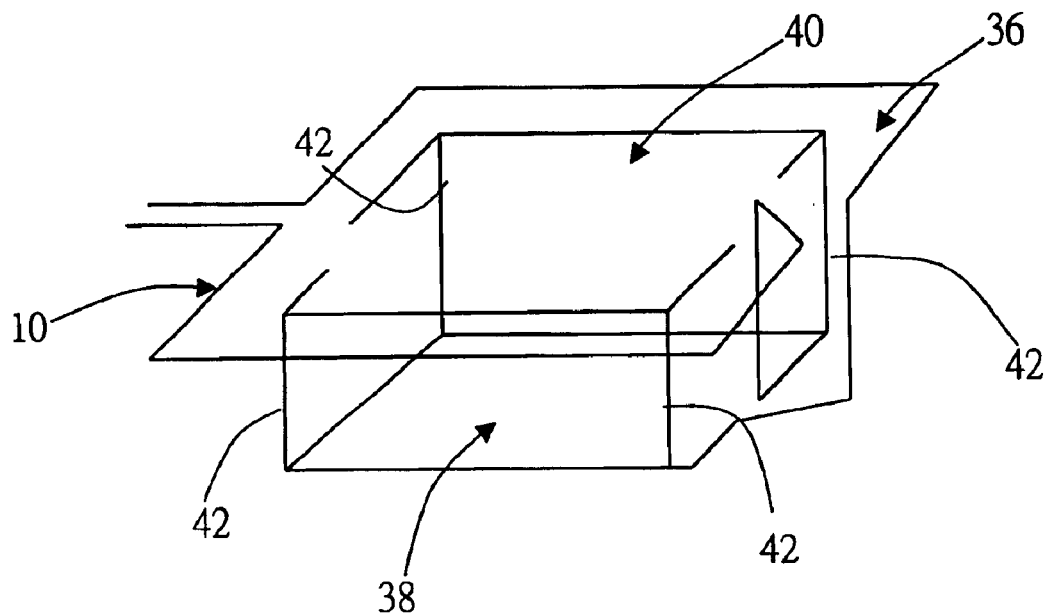
FIG. 6 is a schematic view of symmetric stacked inductor according to another embodiment of the present invention.
Figure 7:
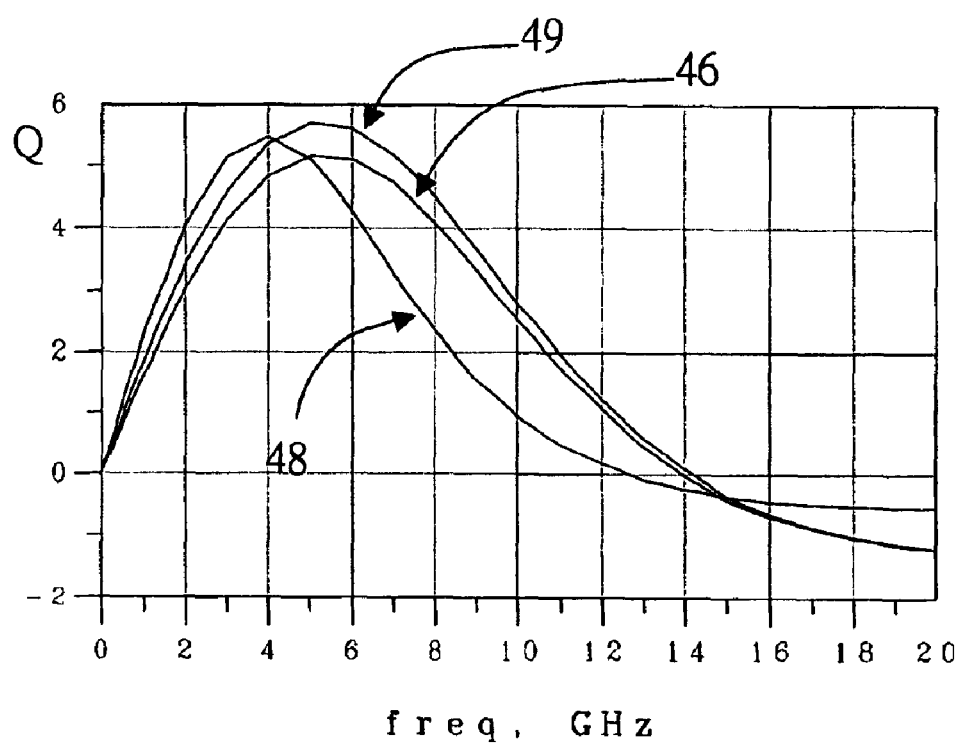
FIG. 7 is a wave diagram for comparing the quality factor (Q) according to an embodiment of the present invention.

FIG. 5 shows a symmetric two-turn inductors. The inductor wire is composed of upper and lower metal layers, connected in parallel by via plugs, except the cross over point to reduce series resistance. Referring to FIG. 6, in another embodiment of the present invention, the outer turn of the symmetric inductor is composed of a single metal layer, while the inner turn of the inductor is composed of upper and lower metal layers, connected in parallel by via plugs, except the cross over point to reduce series resistance and have better self-resonant frequency.

Figure 8A:
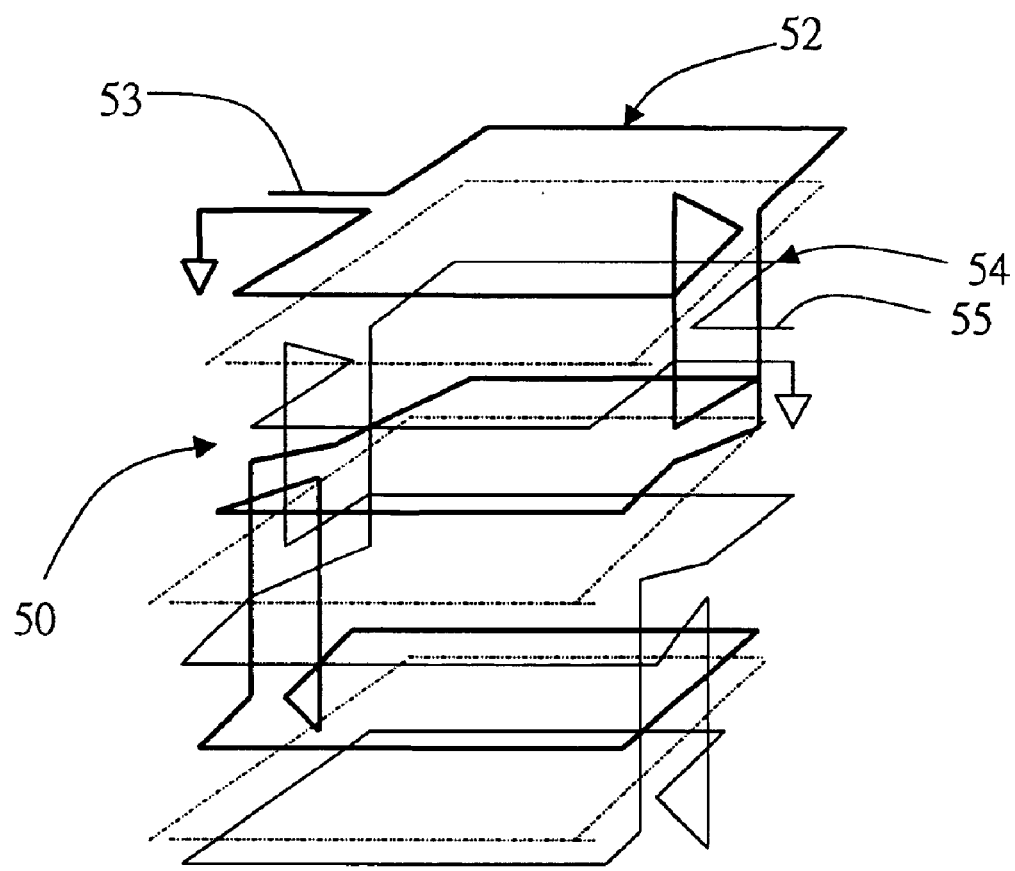
FIG. 8A is a schematic view of the voltage ratio=1:1 of a symmetrical stacked single chip transformer according to an embodiment of the present invention.
Figure 8B:
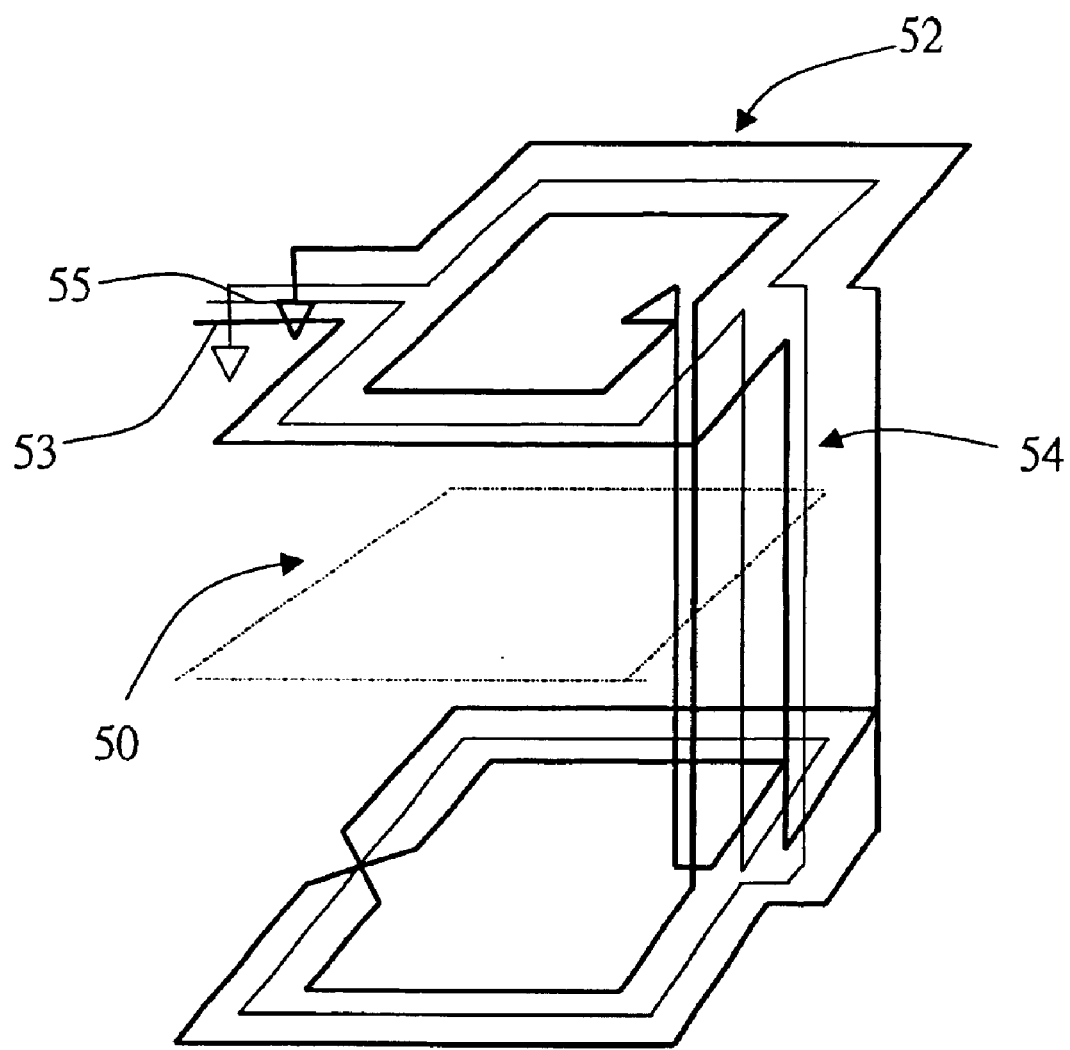
FIG. 8B is a schematic view of the voltage ratio=1:2 of a symmetrical stacked single chip transformer according to an embodiment of the present invention.

Referring to FIGS. 8A and 8B, a symmetrical stacked single chip transformer 50 comprises a first symmetrical stacked inductor 52 and a second symmetrical stacked inductor 54 wherein the first symmetrical stacked inductor 52 includes a first port 53, and the second symmetrical stacked inductor 54 includes a second port 55. FIG. 8A shows the architecture of a 1:1 transformer, and FIG. 8B shows the architecture of a 1:2 transformer.

Figure 9A:
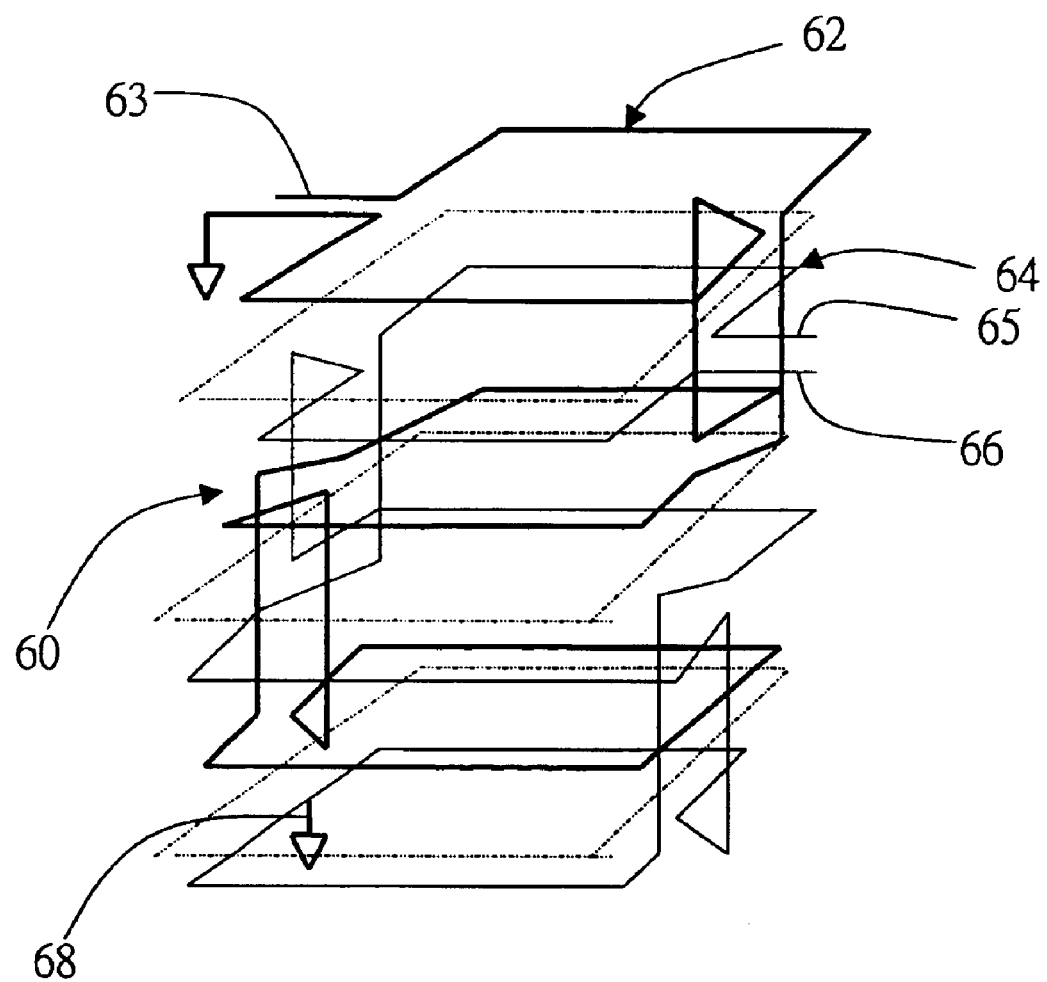
FIG. 9A is a schematic view of the voltage ratio=1:1 of a symmetrical stacked single chip balun element according to an embodiment of the present invention.
Figure 9B:
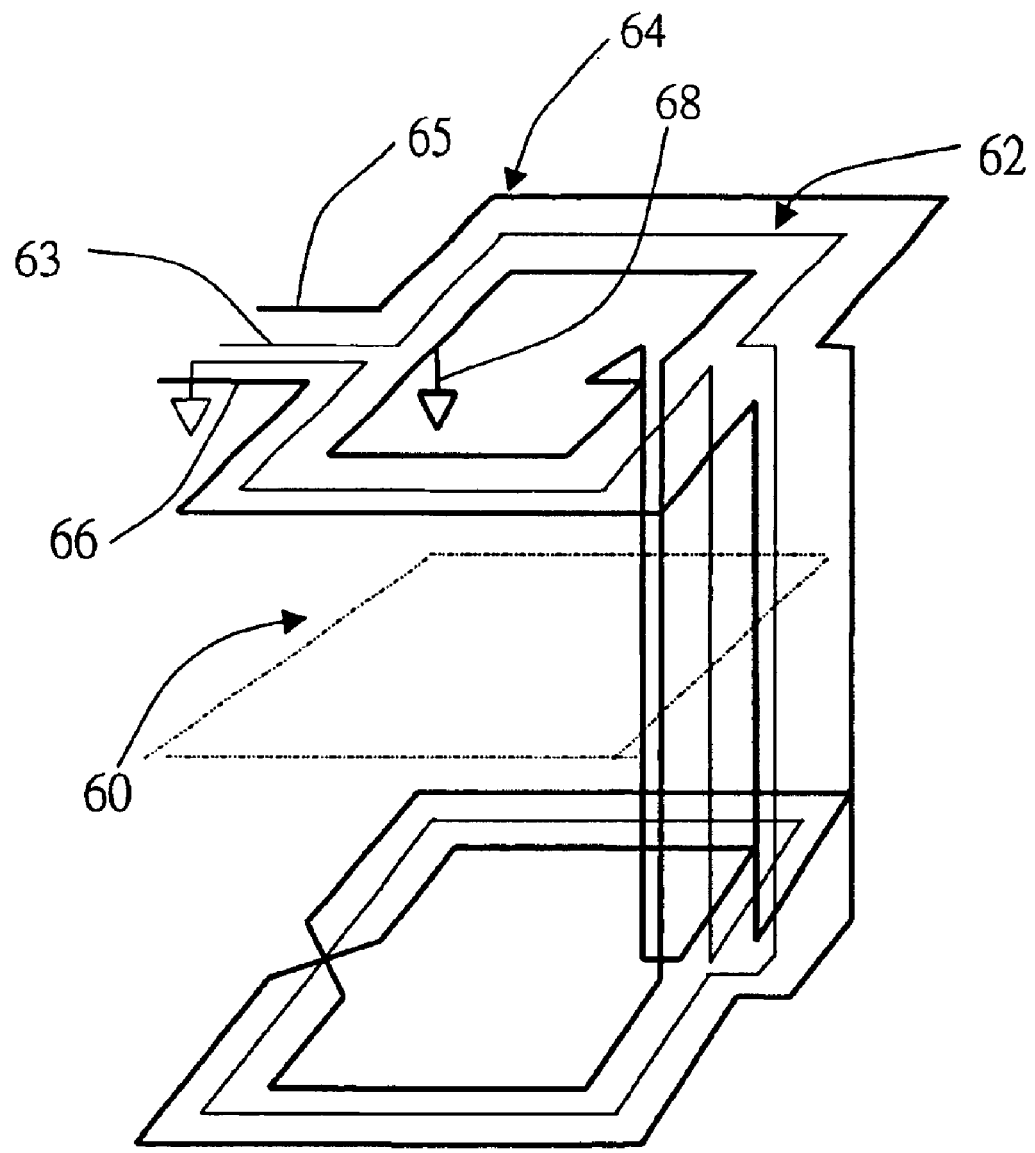
FIG. 9B is a schematic view of the voltage ratio=1:2 of a symmetrical stacked single chip balun element according to an embodiment of the present invention.

Referring to FIGS. 9A and 9B, in another embodiment of the present invention, the balun element 60 comprises a first symmetrical stacked inductor 62 and a second symmetrical stacked inductor 64 to form a symmetrical stacked single chip balun element 60 wherein the first symmetrical stacked inductor 62 includes a first port 63, and the second symmetrical stacked inductor 64 includes a second port 65 and a third port 66. Furthermore, the middle of the second symmetrical stacked inductor 64 is center-tapped to a common mode voltage. FIG. 9A shows the 1:1 balun, and FIG. 9B shows the 1:2 balun.

Figure 10A:
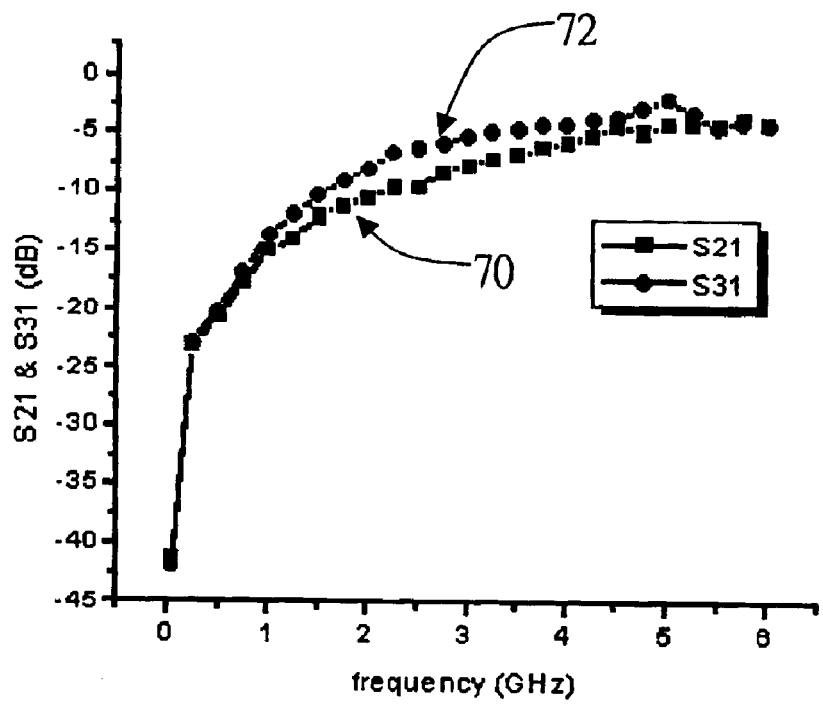
FIG. 10A is a wave diagram of the gain response showing the single chip balun element according to an embodiment of the present invention.
Figure 10B:
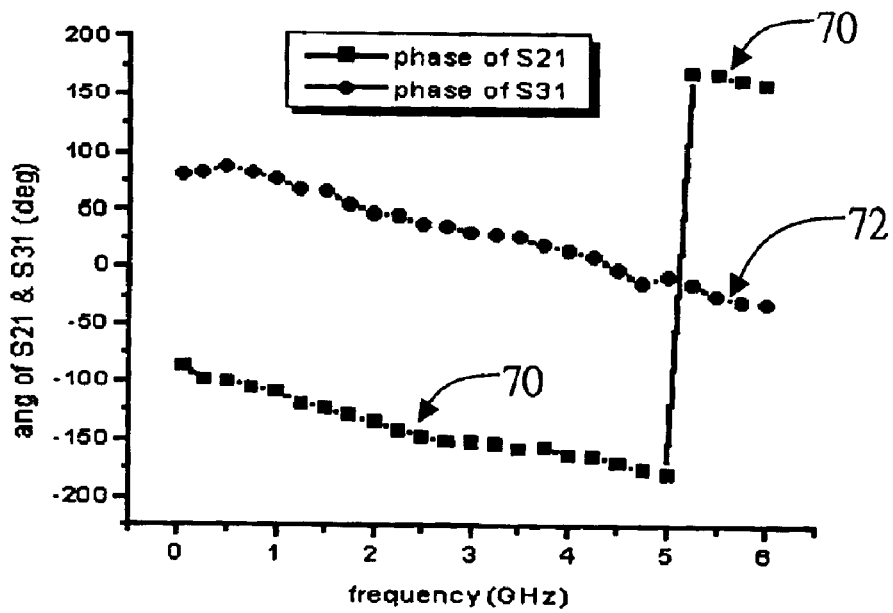
FIG. 10B is a wave diagram of the phase response showing the single chip balun element according to an embodiment of the present invention.

FIGS. 10A and 10B respectively show the measurement results of the gain and phase response of the balun element 60. The S21 curve 70 displays the gain response of the first port 63 and the second port 65, and the S31 curve 72 displays the gain response of the first port 63 and the third port 66. Furthermore, the balun element 60 manifests less than 0.8 dB gain mismatch from 5.25 GHz to 6 GHz and the phase error is about 4° for the 5.25 GHz frequency band of interest.

Figure 11:
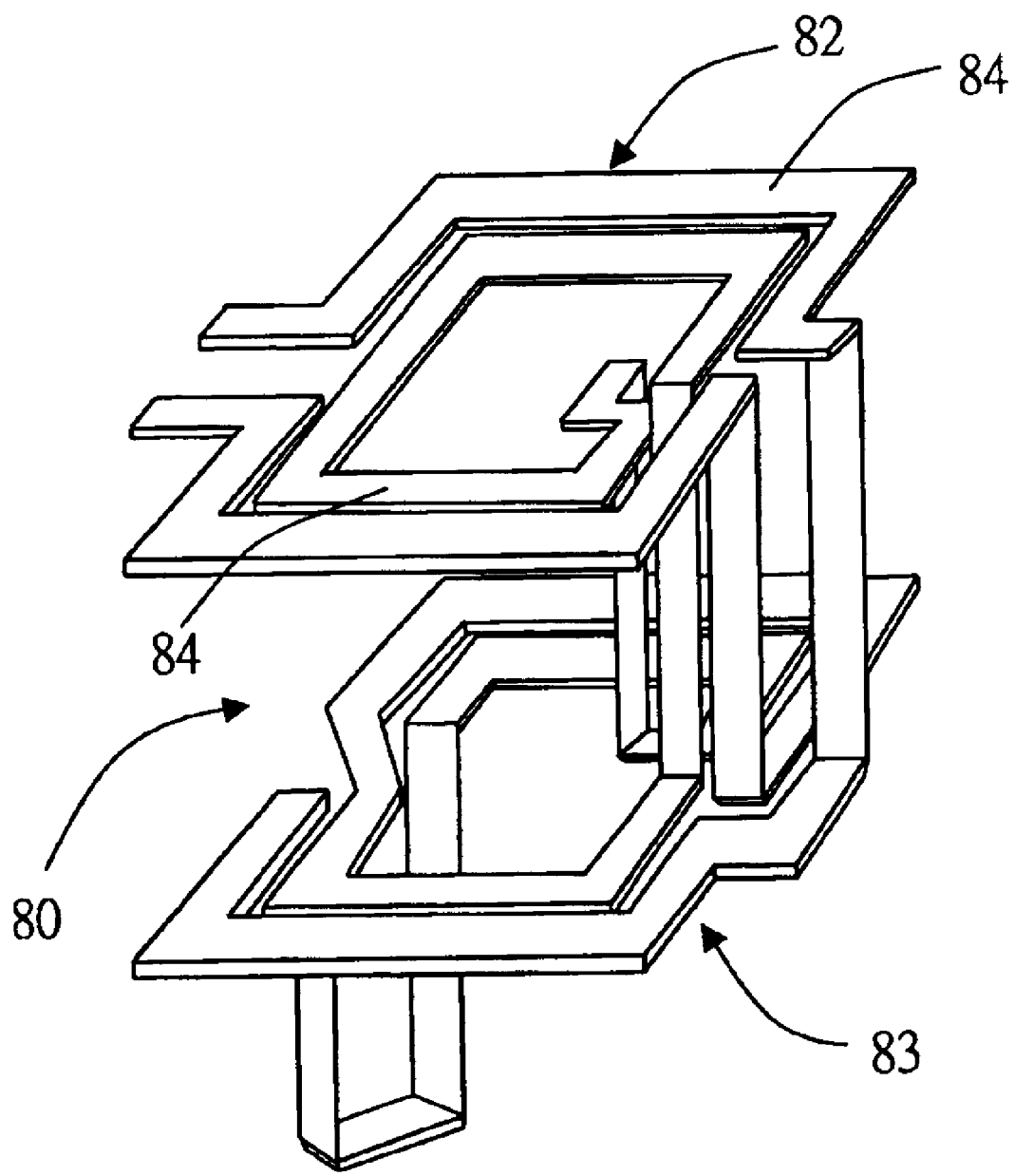
FIG. 11 is a schematic view of a symmetrical stacked inductor according to another embodiment of the present invention.

Referring to FIG. 11, in another embodiment of the present invention, the symmetrical stacked inductor 80 is in a 2 turn 2 layer shape, which comprises a first conductive layer 82 and a second conductive layer 83. The symmetrical stacked inductor 80 is different from the embodiment of FIG. 2, which contains two turns on each layer. The symmetric inductor could be composed of n-layers according to the process. A higher inductance is obtained in the same area.

Figure 12:
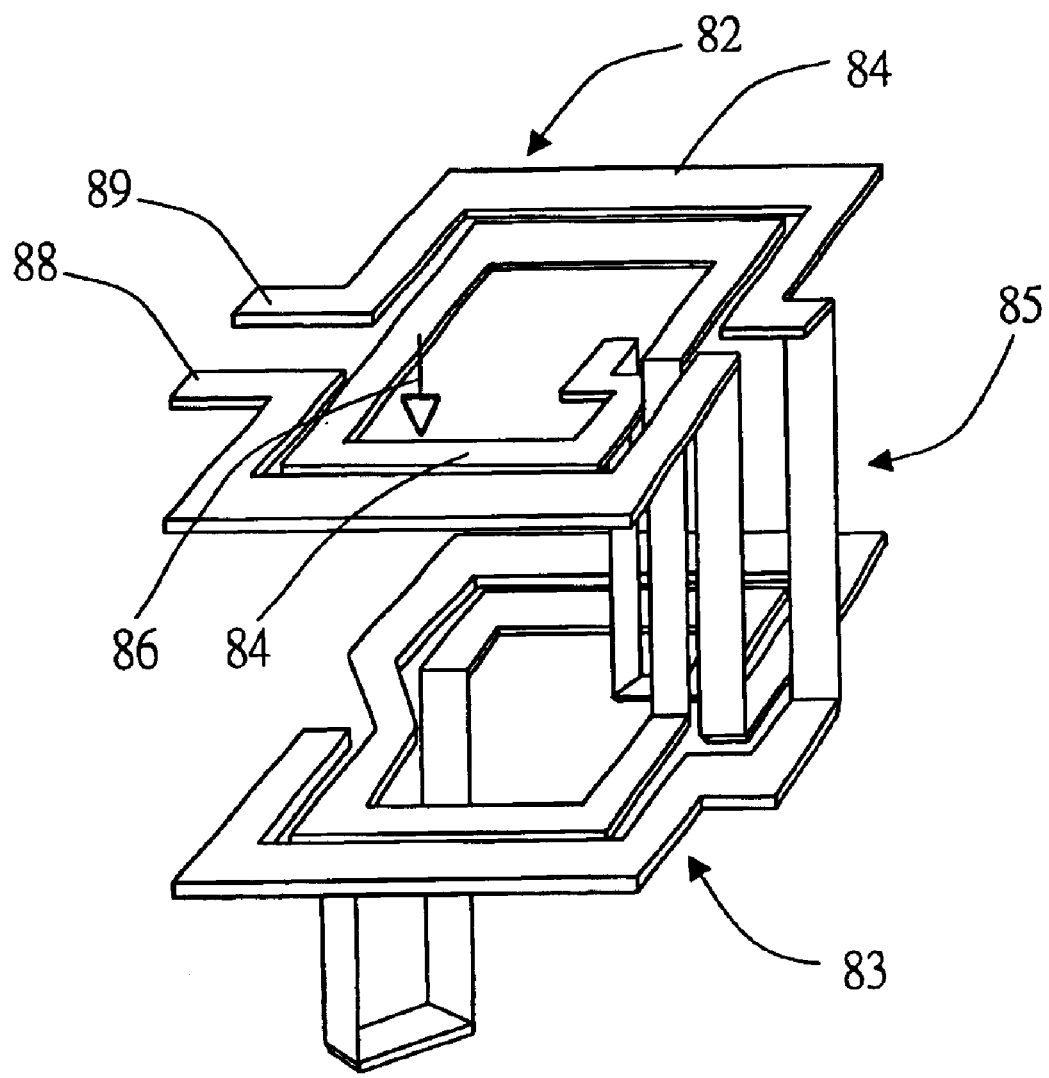
FIG. 12 is a schematic view showing the symmetrical stacked inverting-type transformer according to an embodiment of the present invention.

FIG. 12 shows the architecture of a symmetrical stacked inverting-type transformer 85. The inverting-type transformer 85 comprises a symmetrical stacked inductor 80 with the middle point 86 center-tapped to a common mode voltage. A higher coupling coefficient can be obtained due to tighter magnetic coupling within a small area.

The inductor 10 of the present invention is symmetrical which can be used to replace two asymmetric inductors and save chip area. Also, inductor 10 can be center-tapped to a common mode voltage to form an inverting transformer as is used in an LC voltage controlled oscillator 27.

Therefore, the foregoing is considered as illustrative only of the principles of the invention. Furthermore, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. A symmetrically stacked inductor having at least one winding, comprising:

a plurality of conductive layers, each conductive layer including at least a pair of conductive lines defining a pair of respective portions of geometrically shaped turns of said at least one winding disposed on opposing first and second longitudinally displaced sides thereof, said portions of said turns on each said conductive layer being symmetric with respect to their position on said winding, at least a first of said plurality of conductive layers having a pair of ports formed thereon and respectively coupled to opposing ends of said at least one winding;

an inter-metal dielectric layer disposed between each adjacent pair of said plurality of conductive layers for electrically isolating said adjacent conductive layers; and a plurality of via plugs formed in each inter-metal dielectric for layer, each via plug providing electrical connection of a conductive line on said first side of one conductive layer to a conductive line on said second side of an adjacent conductive layer.

2. The symmetrically stacked inductor of claim 1, further comprising a tapped apparatus connected to a conductive line on a second of said plurality of conductive layers.

3. The symmetrically stacked inductor of claim 1, wherein each said conductive layer includes respective portions of a pair of geometrically shaped turns for each of two windings, each said pair of portions of geometrically shaped turns being respectively disposed symmetrically on opposing first and second longitudinally displaced sides thereof to form a single chip transformer.

4. The symmetrically stacked inductor of claim 1, wherein each said conductive layer includes respective portions of a pair of geometrically shaped turns for each of three windings, each said pair of portions of geometrically shaped turns being respectively disposed symmetrically on opposing first and second longitudinally displaced sides thereof to form a single chip balun element.

5. The symmetrically stacked inductor of claim 1, wherein said geometrically shaped turn portions on one conductive layer are of a different size than said geometrically shaped turn portions on an adjacent conductive layer.

6. A symmetrically stacked inductor having at least one first winding and at least one second winding, comprising:

a plurality of first conductive layers consecutively interspersed and alternating with a plurality of second conductive layers, each of said first conductive layers including at least a pair of first conductive lines defining a pair of respective portions of geometrically shaped turns of said at least one first winding disposed symmetrically on opposing first and second longitudinally displaced sides thereof, said portions of said turns on each said first conductive layer being symmetric with respect to their position on said at least one first winding, each of said second conductive layers including at least a pair of second conductive lines defining a pair of respective portions of geometrically shaped turns of said at least one second winding disposed symmetrically on opposing first and second longitudinally displaced sides thereof, said portions of said turns on each said second conductive layer being symmetric with respect to their position on said at least one second winding, at least one of each of said plurality of first and second conductive layers having a pair of ports formed thereon and respectively coupled to opposing ends of a corresponding one of said at least one first and second windings;

an inter-metal dielectric layer separating each said first conductive layer from an adjacent second conductive layer for electrical isolation thereof;

a plurality of first via plugs formed in each inter-metal dielectric layer, each first via plug providing electrical connection of a conductive line on said first side of one first conductive layer to a conductive line on said second side of another first conductive layer; and a plurality of second via plugs formed in each inter-metal dielectric layer, each second via plug providing electrical connection of a conductive line on said first side of one second conductive layer to a conductive line on said second side of another second conductive layer.

* * * * *